(12) United States Patent
Burström et al.

(10) Patent No.: US 11,762,004 B2
(45) Date of Patent: Sep. 19, 2023

(54) NODE, SYSTEM AND METHOD FOR DETECTING LOCAL ANOMALIES IN AN OVERHEAD POWER GRID

(71) Applicant: Exeri AB, Luleå (SE)

(72) Inventors: Stefan Burström, Boden (SE); Magnus Karlsson, Luleå (SE)

(73) Assignee: Exeri AB, Luleå (SE)

( * ) Notice: Subject to any disclaimer, the term of this patent is extended or adjusted under 35 U.S.C. 154(b) by 130 days.

(21) Appl. No.: 17/428,973

(22) PCT Filed: Feb. 7, 2020

(86) PCT No.: PCT/SE2020/050123
§ 371 (c)(1),
(2) Date: Aug. 5, 2021

(87) PCT Pub. No.: WO2020/162825
PCT Pub. Date: Aug. 13, 2020

(65) Prior Publication Data
US 2022/0137117 A1    May 5, 2022

(30) Foreign Application Priority Data
Feb. 8, 2019   (SE) .................... 1950151-9

(51) Int. Cl.
*G01R 31/08* (2020.01)
*G01P 15/00* (2006.01)
(Continued)

(52) U.S. Cl.
CPC ............ *G01R 31/085* (2013.01); *G01P 15/00* (2013.01); *G01R 29/12* (2013.01); *G01R 33/02* (2013.01)

(58) Field of Classification Search
CPC ............ G05B 19/4183; G05B 19/4185; G05B 23/02; G05B 23/0208; G05B 19/048
See application file for complete search history.

(56) References Cited

U.S. PATENT DOCUMENTS 9,347,972 B2 * 5/2016 Meeker ................ G01R 15/144
10,175,286 B1    1/2019 Reilley
(Continued)

FOREIGN PATENT DOCUMENTS

WO    WO-2018087524 A1    5/2018

OTHER PUBLICATIONS

International Search Report and Written Opinion received for PCT/SE2020/050123 dated Apr. 24, 2020.
(Continued)

*Primary Examiner* — Jermele M Hollington
*Assistant Examiner* — Temilade S Rhodes-Vivour
(74) *Attorney, Agent, or Firm* — MARSHALL, GERSTEIN & BORUN LLP (57) ABSTRACT

A node for detecting local anomalies in an overhead power grid having at least one power line. The node includes a processing unit and a memory, wherein the node further includes: an electric field sensor configured to measure a first parameter related to an electric field around the at least one power line, and a magnetic field sensor configured to measure at least second parameter related to a magnetic field around the at least one power line. The processing unit is configured to: compare the measured first parameter and at least second parameter with historic data stored in the memory to identify local anomalies, and forward data related to the identified local anomalies to a system controller via a communication interface.

18 Claims, 5 Drawing Sheets

(51) Int. Cl.
*G01R 29/12* (2006.01)
*G01R 33/02* (2006.01)

(56) References Cited

U.S. PATENT DOCUMENTS

| | | | |
|---|---|---|---|
| 2005/0040809 A1 | 2/2005 | Uber et al. | |
| 2007/0013232 A1* | 1/2007 | McNally | B60L 3/0023 |
| | | | 307/10.1 |
| 2007/0059986 A1* | 3/2007 | Rockwell | G01R 31/52 |
| | | | 340/10.41 |
| 2008/0106241 A1* | 5/2008 | Deaver | H02J 3/1828 |
| | | | 323/209 |
| 2011/0010118 A1 | 1/2011 | Gaarder | |
| 2012/0036250 A1* | 2/2012 | Vaswani | G01D 4/004 |
| | | | 709/224 |
| 2017/0097435 A1 | 4/2017 | Hull et al. | |
| 2018/0238955 A1* | 8/2018 | Bango | G08B 21/02 |

OTHER PUBLICATIONS

International Preliminary Report on Patentability received for PCT/SE2020/050123 dated Jun. 1, 2021.

* cited by examiner

NODE, SYSTEM AND METHOD FOR DETECTING LOCAL ANOMALIES IN AN OVERHEAD POWER GRID

TECHNICAL FIELD

The present disclosure relates to the field of detecting and localizing failures/anomalies in an overhead voltage grid, especially an overhead medium voltage grid. More particular the invention relates to a node in a distributed sensor network.

BACKGROUND

Today, surveillance of overhead power grids is normally performed indirectly via protection provided in power stations and transformers. Some failures remains undetected and some failures only appears intermittently when the system is automatically reset. The result is that it is often impossible to localize the failure and this in turn leads to long troubleshooting times to find the reason behind and to localize disturbances.

Example of disturbances is:
Break in wires without conductors grounding or shorting
Break in wires and subsequent reverse ground fault
Break in wires and phase against ground
Wire on support beam or wire fallen of the beam and hanging close to ground
Breakdown due to e.g. cracked or dirty isolator
Transfer between wires (phase to phase) or wire to ground, for instance when a tree falls on the wire and create a connection—phase to ground
Down hanging wire due to snow, ice load or overload Troubleshooting of cause and positioning is currently taking place mainly through ocular manual inspection. In the case that the failure persists after restarting the network, sectioning is used to limit the scanning distance.

US 2005/0040809 discloses a device for locating a fault on a power line of a power distribution system using power line property measurement devices. US 2018/0238955 discloses a system for standoff detection of power line hazards and means for data collection. US 2001/0040446 discloses an apparatus for determining the amount and direction of the electric power flowing over a high-power transmission line. WO 2017/216673 discloses a system for dynamic fault detection in an electric grid.

SUMMARY

An object of the present disclosure is to provide a sensor which seeks to mitigate, alleviate, or eliminate one or more of the above-identified deficiencies in the art and disadvantages singly or in any combination.

This object is obtained by a sensor according to claim 1.

An advantage is that a faster response time and less interruptions in power distribution may be achieved since sections in the power grid may be disconnected in order to reconnect functioning sections.

Another advantage is that the nature of the failure, as well as the location of the failure, may be presented without any advanced post analysis of the data acquired at the line agents.

Still another advantage is that the system, including the line agents and communication relay points may be implemented in a power grid without any disruption in services.

According to an aspect, the node is galvanically separated from the power lines and run on an internal energy source, such as one or more batteries. An advantage with the aspect is that the node will not be destroyed by lightning or grid faults.

The node and system aims to detect most types of failures on a power line in a grid, determine the cause of the failure (not only a symptom, such as grounding failure, but also a real cause) which is possible to localize. This also means that faults that have not caused a malfunction must also be detected, and presumably dangerous conditions without malfunctioning must be detected.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Aspects of the present disclosure will be described more fully hereinafter with reference to the accompanying drawings. The node and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Some of the example embodiments presented herein are directed towards a sensor adapted to be implemented in a distributed sensor network for monitoring an overhead voltage grid. As part of the development of the example embodiments presented herein, a problem will first be identified and discussed.

Presently, a network operator becomes aware of a fault in the power grid in different ways, e.g.:
1) A protection circuit of a transformer is released due to over currents,
2) A protection circuit of a transformer is released due to ground currents
3) Network users contact the network operator and file an error report
4) Regular inspections of the network structure The first and second item on the list only indicate the symptom and does not give any information regarding where in the power network the fault is localized. The root cause to the failure is not apparent. If the fault is maintained after re-energizing the power network, the only available option is to divide the power network into sections and re-energize each section to identify which sections has a problem. The manual inspection will take place to identify the location and cause of the fault. However, this is not a 100% reliable solution, since certain faults cannot be detected by sectioning. An example is intermittent faults only appearing when certain conditions are met (for instance due to rain or windy conditions). Another problem with sectioning is that functioning sections may be identified as a faulty section by mistake and resources have to be used to inspect a section without finding any faults. There is also a problem with sectioning the power network into many sections due to a lack of power separators used to divide the network into sections.

The third item on the list requires, if the protecting circuit of the transformers are not released, manual inspection. This is very time consuming since it is not possible to reduce the inspections to a certain section of the power grid.

The fourth item on the list will provide a possibility to identify certain faults easily identified by manual inspections, but some faults are hard to identify such as cracked isolators.

Certain faults cannot be identified before an incident or accident occurs. Such faults are down hanging wires, broken or leaning posts, a broken wire not connecting to ground or creates a short circuit, occasions when there is no symptom and no one reports an error.

Systems designed to detect and localize failures in the power grid has traditionally been directed to measuring an absolute value of parameters related to the magnetic field or the electric field. Reliable measurements of absolute values are nearly impossible to obtain. The goal of this invention is to provide a method in which relative values of parameters related to both the magnetic field and the electric field are measured and analyzed to identify anomalies indicating a possible failure.

Figure 1:
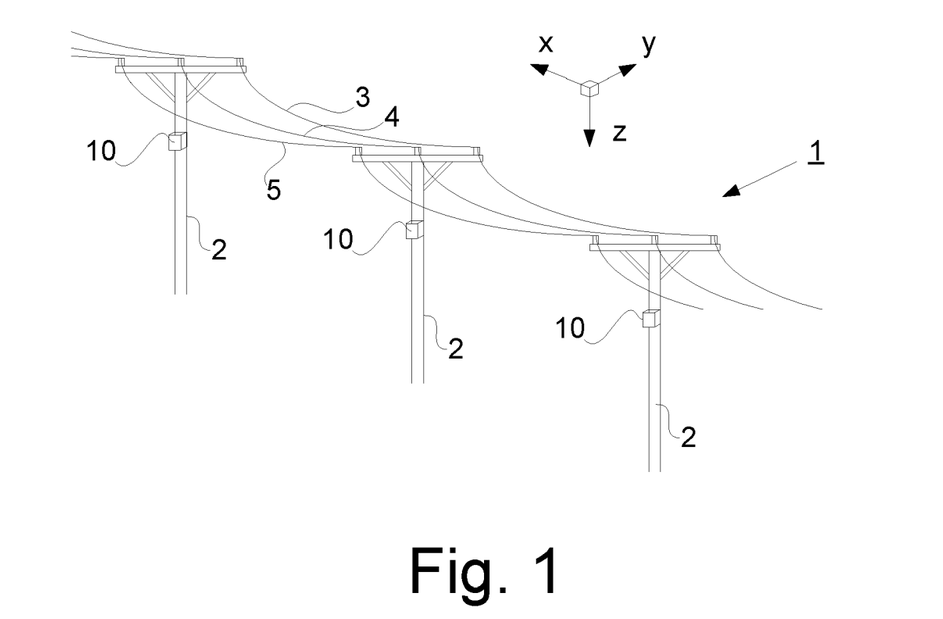
FIG. 1 illustrates poles in a power grid provided with a node according to the invention.

The present invention relates to a node and system for detecting anomalies in medium voltage overhead lines, as they are prone to faults and often present in areas where established communications is scarce or unreliable. The system is designed to detect and position the following faults:
Short Circuits (Phase-to-phase and Phase-to-ground)
Missing Phase
Whether a line is out of its normal position on top of a pole
Leaning or broken pole
Broken or contaminated insulator
Current leaking through pole The invention is implemented in a node 10, also called line agent, that is mounted directly on the poles 2 in the grid 1, about 1.5 meter below the wires 3-5 of the grid 1, as illustrated in FIG. 1. The node 10 is configured to measure the fields, magnetic field using a B field sensor 11 and the electric field using an E field sensor 12, and their variations. Furthermore, a processing unit, μP, 13 is configured to separate normal and abnormal behaviour using historic data stored in a memory 14. According to some embodiment, data related to environmental aspects (such as temperature, humidity, etc.) is communicated to the line agent via a communication interface 15, and preferably stored in the memory 14 to be used to detect anomalies in the overhead power grid 1, i.e. separate normal and abnormal behaviour.

Figure 2:
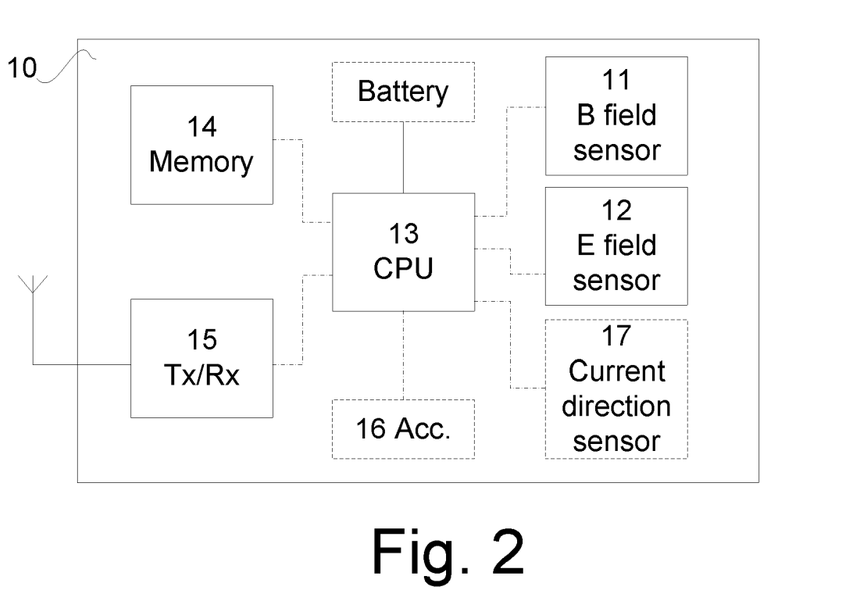
FIG. 2 illustrates an example node.

Thus, the present invention is a node 10 for detecting local anomalies in an overhead power grid 1 having at least one power line 3-5. The node 10 comprises a processing unit 13 and a memory 14, wherein the node 10 further comprises an electric field sensor 12 configured to measure a first parameter related to an electric field around the at least one power line 3-5, and a magnetic field sensor 11 configured to measure at least second parameter related to a magnetic field around the at least one power line 3-5. The processing unit 13 is configured to: identify local anomalies by comparing the measured first parameter with data stored in the memory 14 to establish a first relative parameter and by comparing the measured at least second parameter with data stored in the memory 14 to establish at least a second relative parameter, and forward data related to the identified local anomalies to a system controller 22 via a communication interface 15. Data stored in the memory 15 may be historic data from previous measurements, estimated data based on knowledge from other nodes, calculated data based on mathematical models, etc.

The magnetic field sensor 11 and the electric field sensor 12 are designed to measure variations in the respective field to monitor anomalies compared to data stored in the memory for the same node.

According to some embodiments, the local anomalies are further identified based on local variations in meteorological data, since weather conditions may affect measured variations. Examples of meteorological data comprises any in the group: temperature, humidity, weather forecasts. One example is that increased temperature will increase the length of the wires, and thus move the wires closer to the ground. According to some embodiments, the node is galvanically separated from the at least one power line 3-5 and run on an internal energy source, to make sure that the line agents, or nodes, 10 are not destroyed by lightning or grid faults, they may be galvanically separated from the lines themselves, and run on batteries for 10 years.

According to some embodiment, the node is configured to operate in two modes. The first mode is a data collection and analysis mode, and the second mode is a data transfer mode. The second mode is initiated by a request received via the communication interface 15.

According to some embodiment, the node further comprises an accelerometer 16 configured to detect relative movements in at least one direction, and the processing unit 13 is further configured to identify local anomalies when the detected relative movement in at least one direction exceeds a predefined threshold value.

Figure 4:
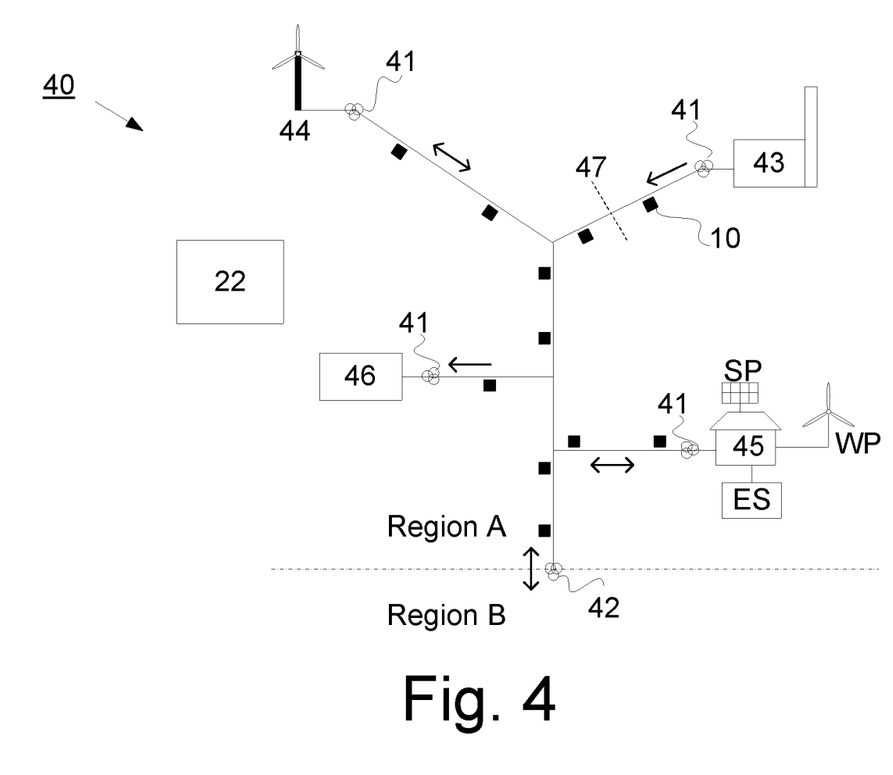
FIG. 4 shows a power grid illustrating embodiments using a current direction sensor in a power grid.

According to some embodiment, the node is provided with a current direction sensor 17 to detect the direction of current in the power lines. This is useful information to detect the position of a fault in power grids having multiple feeding points, as illustrated in FIG. 4.

According to some embodiment, the node is further configured to receive data from a sensor attached to one of the at least one power line to detect the angle of power line. This will ensure that power line is far enough from ground to cause a short since the height of the pole is known.

According to some embodiment, the magnetic field sensor 11 is configured to measure the second and a third parameter related to the magnetic field. The second parameter is related to the magnetic field in a direction parallel with the at least one power line 3-5 (marked as x direction in FIG. 1) and the third parameter is related to the magnetic field in a direction perpendicular to the ground (marked as z direction in FIG. 1).

All the line agents are completely self-calibrating, meaning that they need no specific settings or configuration to be able to do their job. This is because the line agents establish a relative parameter of the fields instead of using absolute values. The software can be upgraded remotely over the communication interface 15, meaning that after mounting the line agents 10 to the poles 2, they will operate without any maintenance.

Different types of line agents may be implemented depending on their position in the power grid. A first type is placed at crosspoints, endpoints and by net elements like net stations and breakers, and a second type is placed in every single pole. The second type does not only give a much higher resolution in positioning, but also can find more types of faults. The two kinds of line agents may be mixed freely in the grid to fulfil the coverage and resolution wanted depending on topology, vegetation and closeness to roads.

Figure 3:
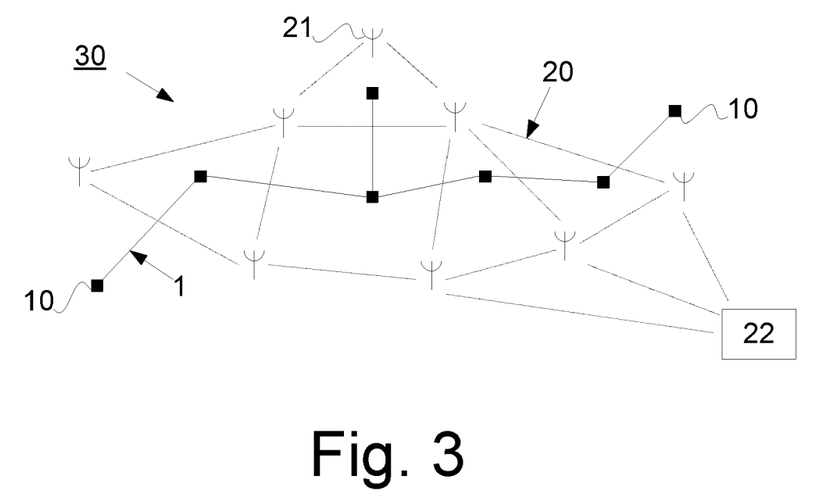
FIG. 3 illustrates a system for detecting anomalies in a power grid.

FIG. 3 illustrates a communication system 20 configured to transfer data between the line agents 10 and a system controller 22 (server) via communication relay points, CRP, 21. They communicate by radio with the line agents 10, and are placed in key points to reach as many of the line agents as possible, thus creating a meshed network with in-built redundancy. This means that if a CRP 21 is out of order for some reason, another CRP will automatically take over its duties. The CRPs are preferably connected to the distribution side of the grid for power supply, but also has batteries to be able to convey alarms containing the cause of the problem when the power has been automatically shut off.

As mentioned above, the system controller 22, also known as ICCU, the Information Collection and Conclusion Unit, exchanges information with the CRPs 21 (and thus with the line agents 10), analyses this together with its knowledge of the grid topology and its internal dependencies, using AI algorithms. This results in finalized alarms that are presented to the user in a Situation Picture, a map of the area where problems are presented in real-time at their localized position. With this knowledge, it is also easy to add presentation of lines that are unnecessarily affected by the problem and where power may be restored by isolating the fault, and how this isolation is done most efficiently.

It has been verified that the loss of a single (or even multiple) Line Agent will not affect the performance of the system as a whole. The AI will automatically adapt to the lost points, even if the resolution in fault localization decreases accordingly. Neither will a lost CRP 21 affect the system in any way due to the mesh configuration.

So far, it has been verified that the system can pinpoint the exact parts of the grid that are out of power, making it possible to e.g. know when a planned work along the line has actually started.

The present invention relates to a system 30 for detecting anomalies in an overhead power grid 1 comprising a plurality of nodes 10 as described in connection with FIG. 2, a plurality of communication relay points, CRP 21, and a system controller 22. Each node 10 is configured to forward data related to identified anomalies to the system controller 22 via at least one CRP 21, and the system controller 22 is further configured to:
  synchronize data from different nodes,
  identify system level anomalies based on the synchronized data, and
  identify the failure and location based on the system level anomalies.

According to some embodiments, the plurality of CRP in the system 30 are arranged in a mesh network.

According to some embodiments, the system controller 22 is further configured to send a request to transfer data from each node in the system, e.g. by sending hearth beats.

ILLUSTRATING EXAMPLES

A first example relates to the below exemplified type of faults where certain events will occur that will cause the power to be disconnected in the whole or parts of a power grid:
  A grounded connection to a phase, e.g. via a tree, resulting in a ground current above a predetermined threshold,
  Short circuit phase to phase causing overcurrents or unbalance
  Broken isolator causing an arc
  Backwards ground fault when line breaks and the line is grounded, but not on the feeding side.

These are different events that will activate the transformer protection and the power will be disconnected.

A second example relates to the below exemplified type of faults where certain events will occur that normally will not cause the power to be disconnected in the whole or parts of a power grid:
  A power line is dislocated from the isolator and repositioned on the beam, which causes the pole to be electrified with small or no noticeable ground currents through the pole
  Cracked isolator without any arc causing a creep current
  The power line is dislocated from the isolator and hanging loose beside the pole (not on beam) without being in contact with the ground
  The pole is dislocated by rain, ground frost or braking.

These are different events that may lead to a lethal condition for service staff, but will normally not activate the transformer protection.

For all the above mentioned types of fault the procedure is as follows:

The sensors of each node in the system will continuously monitor and analyze the measured parameters. One or more nodes may identify an anomalies that deviates from its normal variation within the power grid. It should be noted that a variation may be perceived completely different by different nodes since each node only observe relative variations of the measured parameters. This is due to the geometry of the power lines, the mounting of the nodes to the poles in relation to the power lines and disturbing environments, such as rail roads and other power grids.

A first analysis is performed in each node in the sensor network, and if the node can determine which type of fault has occurred, a message is transmitted to the system controller in the server. The message contains information regarding the type of fault and the deviating events being a mathematical description of the changes that the sensors register during the events. If the node cannot determine the type of fault, the mathematical description of the changes that the sensors register during the events is transmitted to the system controller.

This message together with messages from other nodes in the sensor network is transported through the communication network to the controller in the server. The server has knowledge of all nodes within the communication network and the physical properties of the power grid, e.g. topology. In addition, the server may have knowledge of other types of input data, such as meteorological data. Based on this information, the controller is configured to determine the type of fault and where in the power grid the fault is located.

The result is thereafter stored and presented in the monitoring system.

FIG. 4 shows a power grid 40 illustrating embodiments using nodes 10 with a current direction sensor. A number of nodes are distributed along the power lines. The arrows along the power lines indicate the possible directions of current in each branch. A transformer 41 is positioned at the end of each branch to be able to disconnect the power grid from any load/producer. In addition, a transformer 42 is provided between different regions, region A/region B, in the power grid 40 to disconnect the regions if necessary. A number of producers, a power plant 43, Wind mill 44 and a house 45, produce energy that is transported into the power grid, as indicated by the arrows. The house 45 is provided with solar panels, SP, Wind power, WP, and Energy Storage, ES, that may supply energy to the power grid 40. A number of loads are also illustrated, the wind mill 44 will consume power under non-windy conditions, an industry 46 consumes power when operating and the house 45 may consume power, e.g. when charging the energy storage, during a calm night. The nodes 10 wirelessly communicate with a server 22 (as illustrated in FIG. 3).

The current direction sensor is used to detect and localize faults in the power grid, especially when being fed from multiple feeding points. In this example up to four different power sources and feeding points, i.e. power plant 43, wind mill 44, house 45 or from Region B. The nodes are provided with the functionality described in connection with FIG. 2 including the current direction sensor 17, and each node measures the relative changes in the electric and magnetic fields. Nodes that only sense a fault current without knowing the direction may not determine where the fault is located. This is especially true when the power grid 40 is provided with several sources from different directions. If a fault occurs at location 47, e.g. one power line is shorted, many nodes will indicate an anomaly since the energy provided by the power plant 43 on that power line will not reach the rest of the power grid 40. When the direction of current changes in the power grid, it may be difficult to determine where the fault is located. Changes in consumption by the loads may also affect the direction of the current in some nodes.

The additional current direction information from all nodes is used by the server 22 to calculate the position of the fault by eliminating non applicable locations.

Figure 5A:
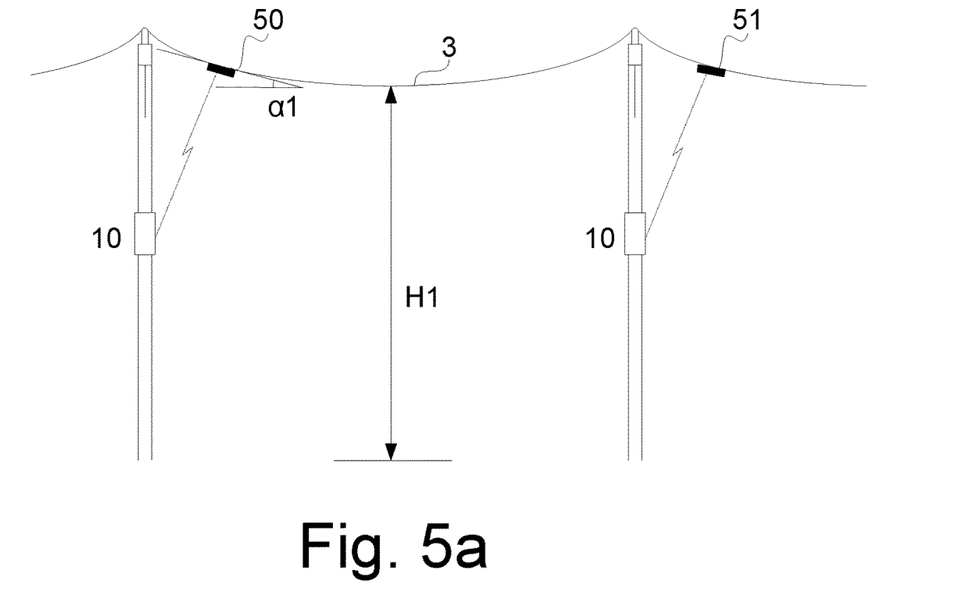
FIGS. 5a and 5b illustrate poles in a power grid provided with a node with an angular sensor according to some embodiments.
Figure 5B:
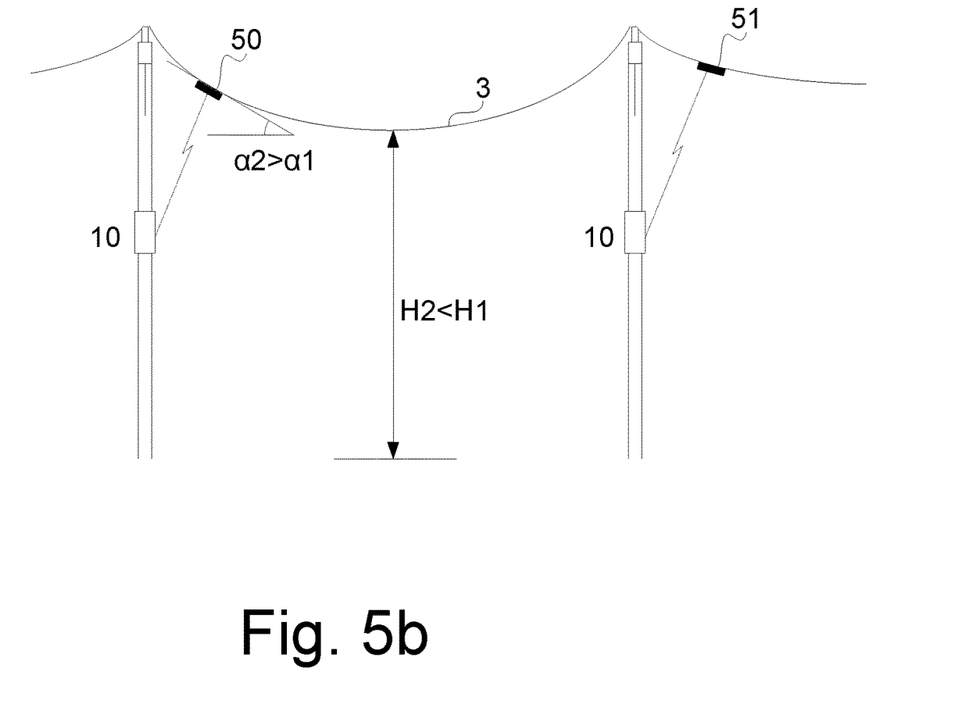

FIGS. 5*a* and 5*b* illustrate poles in a power grid provided with a node with an angular sensor according to some embodiments. Sensors 50, 51 are attached to a power line 3 and wirelessly coupled to the node 10 to receive data from each sensor to detect the angle α of power line in order to identify local anomalies when the detected angle exceeds a predefined maximum angle α2, as illustrated in FIG. 5*b*.

In FIG. 5*a*, the detected angle is α1, indicate that the power line 3 is a predetermined distance of the ground (corresponding to a height H1). Due to certain events, e.g. snow and ice is making the power line 3 heavy, the angle detected by sensor 50 exceeds the predetermined threshold of α2 (corresponding to a reduced height H2) and an anomaly is detected.

Figure 6:
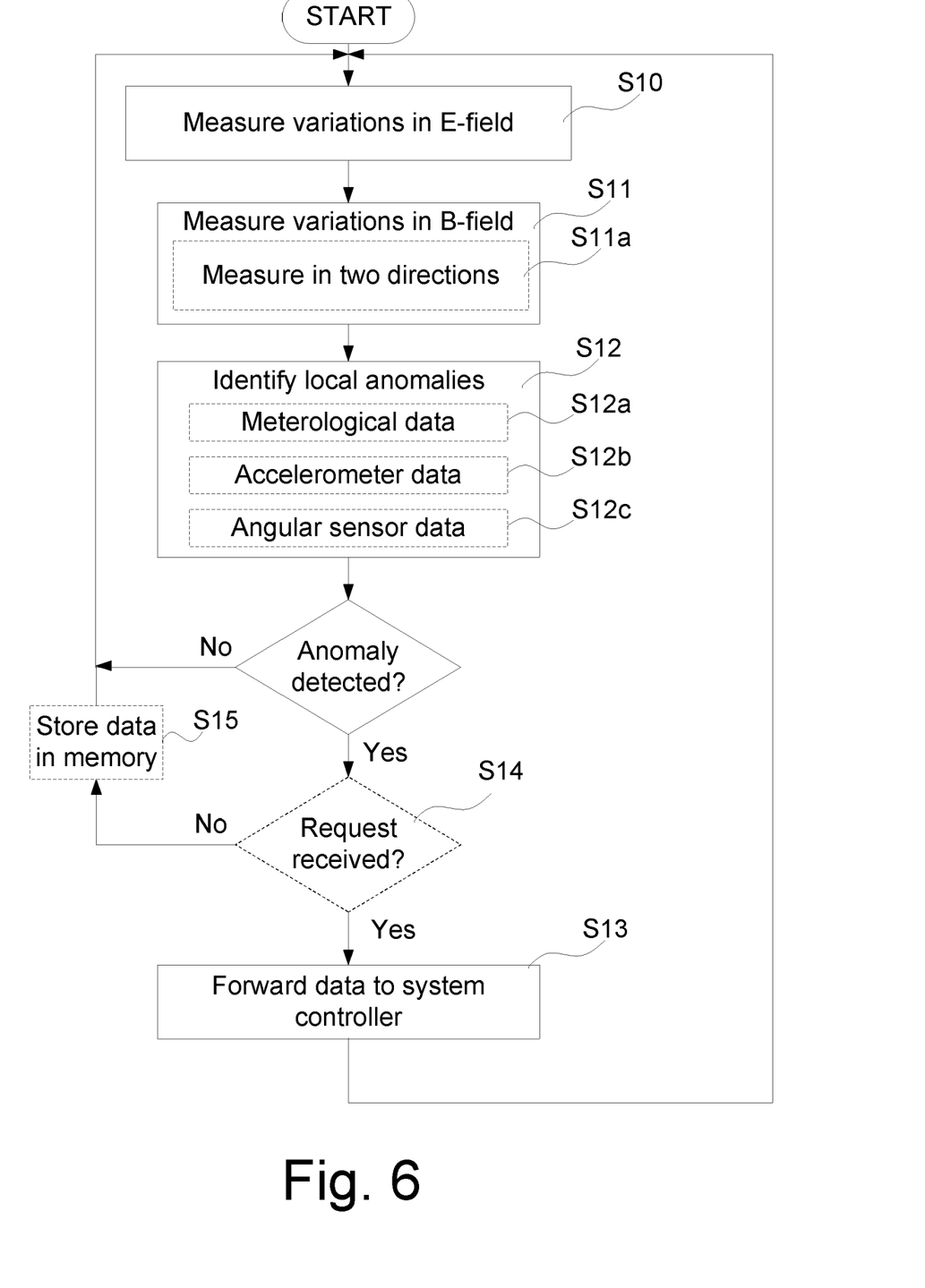
FIG. 6 is a flow chart illustrating a process in a node for detecting local anomalies in a power grid.

FIG. 6 illustrates a flowchart of a method for detecting local anomalies in an overhead power grid having at least one power line. The method comprises:
measuring S10 a first parameter, at regular intervals, related to an electric field around the at least one power line using an electric field sensor,
regularly measuring S11 at least a second parameter, at regular intervals, related to a magnetic field around the at least one power line using a magnetic field sensor,
comparing S12 the measured first parameter and at least second parameter with historic data stored in the memory to establish a first relative parameter and at least a second relative parameter in order to identify local anomalies, and forwarding S13 data related to the identified local anomalies to a system controller via a communication interface.

According to some embodiment, the method further comprises identifying S12*a* local anomalies based on local variations in meteorological data. According to some embodiments, the method further comprises selecting the meteorological data to be any in the group: temperature, humidity, forecasts, etc.

According to some embodiment, the method further comprises configuring the node to operate in two modes, wherein the first mode is a data collection and analysis mode, and the second mode is a data transfer mode. The method also comprises initiating S14 the second mode by a request received via the communication interface. If an anomaly has been detected and no request to forward the data to the server has been received, the data is stored S15 in the memory and transmitted when the request is received.

According to some embodiments, the node further comprises an accelerometer configured to detect relative movements in at least one direction, and the method further comprises identifying S12*b* local anomalies when the detected relative movement in at least one direction exceeds a predefined threshold value.

According to some embodiments, the method further comprises receiving data from a sensor attached to one of the at least one power line to detect the angle of power line in order to identify S12*c* local anomalies when the detected angle exceeds a predefined maximum angle, as illustrated in FIGS. 5*a* and 5*b*.

According to some embodiments, the method further comprises receiving data related to current direction in the power lines in order to identify where a local anomaly has occurred when the overhead power grid is supplied with power from multiple power sources.

Figure 7:
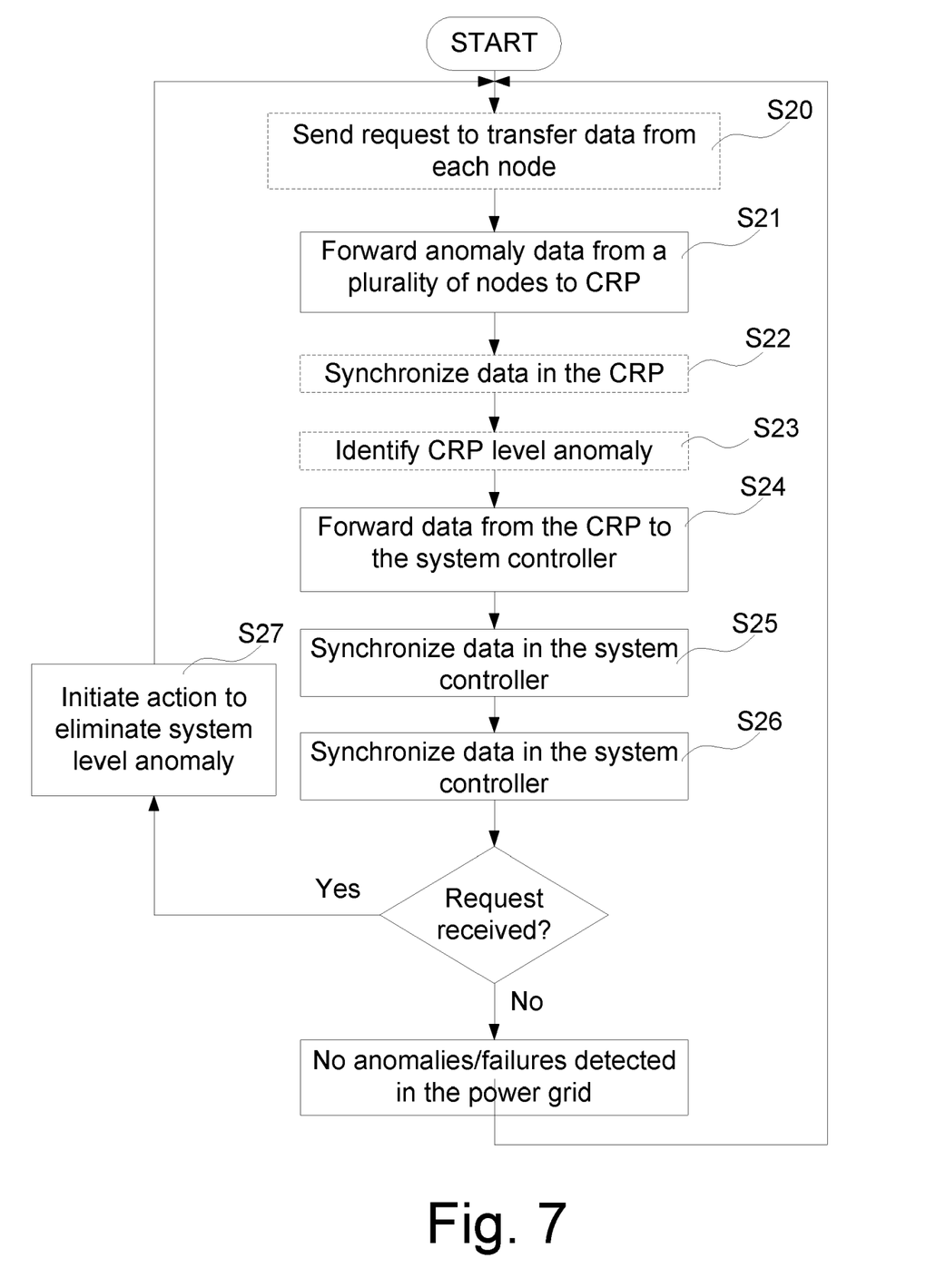
FIG. 7 is a flow chart illustrating a process in a system for detecting anomalies in a power grid.

According to some embodiments, the method further comprises measuring S11*a* the second and a third parameter related to the magnetic field, wherein the second parameter is related to the magnetic field in a direction parallel with the at least one power line and the third parameter is related to the magnetic field in a direction perpendicular to the ground. FIG. 7 illustrates a flowchart for the system described in connection with FIG. 3 to collect data from the nodes and identify system level anomalies (failure and location) and initiate actions to eliminate them.

The method comprises forwarding S21 anomaly data from a plurality of nodes to a communication relay point, CRP. According to some embodiment, the system controller sends S20 a request to transfer data from each node before it is forwarded to the CRP.

According to some embodiment, the anomaly data received from a plurality of nodes is synchronized S22 in the CRP, and CRP level anomalies are identified, S23. The reason for these two optional steps is to minimize the size of the data transferred from the nodes to the system controller.

The data received from the nodes is forwarded S24 to the system controller, either as the raw data received from the nodes or as processed data. The system controller synchronizes data received from a plurality of CRP's and system level anomalies are thereafter identified similar to the process disclosed for the nodes above.

If no system level anomaly is identified, the power grid is OK and no actions are necessary. However, if a system level anomaly is identified, actions needs to be initiated S27 to eliminate the anomaly.

Aspects of the disclosure are described with reference to the drawings, e.g., block diagrams and/or flowcharts. It is understood that several entities in the drawings, e.g., blocks of the block diagrams, and also combinations of entities in the drawings, can be implemented by computer program instructions, which instructions can be stored in a computer-readable memory, and also loaded onto a computer or other programmable data processing apparatus. Such computer program instructions can be provided to a processor of a general purpose computer, a special purpose computer and/or other programmable data processing apparatus to produce a machine, such that the instructions, which execute via the processor of the computer and/or other programmable data processing apparatus, create means for implementing the functions/acts specified in the block diagrams and/or flowchart block or blocks.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A node for detecting local anomalies in an overhead power grid having at least two power lines supported by poles, wherein the node is configured to be mounted directly on a pole in the overhead power grid, and wherein the node comprises a processing unit and a memory, wherein the node further comprises:
   an electric field sensor configured to measure a first parameter related to an electric field around the at least two power lines,
   a magnetic field sensor configured to measure at least one second parameter related to a magnetic field around the at least two power lines, and
   an accelerometer configured to detect relative movements in at least one direction, wherein the processing unit is configured to:
   identify local anomalies when the detected relative movement in at least one direction exceeds a predefined threshold value,
   compare the measured first parameter and the at least one second parameter with historic data stored in the memory to establish a first relative parameter and at least a second relative parameter to identify local anomalies, and
   forward data related to the identified local anomalies to a system controller via a communication interface.

2. The node according to claim 1, wherein local anomalies are further identified based on local variations in meteorological data.

3. The node according to claim 2, wherein the meteorological data comprises any in the group: temperature, humidity, forecasts.

4. The node according to claim 1, wherein the node is galvanically separated from the at least two power lines and run on an internal energy source.

5. The node according to claim 1, wherein the node is configured to operate in two modes, the first mode is a data collection and analysis mode, and the second mode is a data transfer mode, and wherein the second mode is initiated by a received request via the communication interface.

6. The node according to claim 1, wherein the node is further configured to receive data from a sensor attached to one of the at least two power lines to detect the angle of the power lines.

7. The node according to claim 1, wherein the magnetic field sensor is configured to measure the second and a third parameter related to the magnetic field, and that the second parameter is related to the magnetic field in a direction parallel with the at least two power lines and the third parameter is related to the magnetic field in a direction perpendicular to the ground.

8. A system for detecting anomalies in an overhead power grid comprising a plurality of nodes according to claim 1, a plurality of communication relay points, CRP, and a system controller, wherein each node is configured to forward data related to identified anomalies to the system controller via at least one CRP, and the system controller is further configured to synchronize data from different nodes, identify system level anomalies based on the synchronized data, and identify the failure and location based on the system level anomalies.

9. The system according to claim 8, wherein the plurality of CRP are arranged in a mesh network.

10. The system according to claim 8, wherein the system controller is further configured to send a request to transfer data from each node in the system.

11. A method for detecting local anomalies in an overhead power grid having at least two power lines supported by poles, wherein the node further comprises an accelerometer configured to detect relative movements in at least one direction, wherein the method comprises:
    identifying local anomalies when the detected relative movement in at least one direction exceeds a predefined threshold value,
    regularly measuring a first parameter related to an electric field around the at least two power lines using an electric field sensor arranged in a node which is mounted directly on a pole in the overhead power grid,
    regularly measuring at least a second parameter related to a magnetic field around the at least two power lines using a magnetic field sensor, arranged in the node,
    comparing, in the node, the measured first parameter and at least second parameter with historic data stored in a memory, arranged in the node, to establish a first relative parameter and at least a second relative parameter in order to identify local anomalies, and
    forwarding data related to the identified local anomalies to a system controller via a communication interface.

12. The method according to claim 11, further comprising identifying local anomalies based on local variations in meteorological data.

13. The method according to claim 12, further comprising selecting the meteorological data to be any in the group: temperature, humidity, forecasts.

14. The method according to claim 11, wherein the method further comprises:
    configuring the node to operate in two modes, the first mode is a data collection and analysis mode, and the second mode is a data transfer mode, and
    initiating the second mode by a request received via the communication interface.

15. The method according to claim 11, further comprising receiving data from a sensor attached to one of the at least two power lines to detect the angle of power line.

16. The method according to claim 11, further comprising measuring the second and a third parameter related to the magnetic field, wherein the second parameter is related to the magnetic field in a direction parallel with the at least one power line and the third parameter is related to the magnetic field in a direction perpendicular to the ground.

17. A computer program for detecting anomalies in an overhead power grid, comprising instructions which, when executed on at least one processor unit, cause the at least one processor to carry out the method of regularly receiving a first parameter related to an electric field around at least two power lines measured using an electric field sensor arranged in a node which is mounted directly on a pole in the overhead power grid,
    receiving information on relative movements in at least one direction, and identifying local anomalies when the detected relative movement in at least one direction exceeds a predefined threshold value,
    regularly receiving at least a second parameter related to a magnetic field around the at least two power lines measured using a magnetic field sensor, arranged in the node,
    comparing, in the node, the received first parameter and at least second parameter with historic data stored in a memory, arranged in the node, to establish a first relative parameter and at least a second relative parameter in order to identify local anomalies, and
    forwarding data related to the identified local anomalies to a system controller via a communication interface.

18. A computer-readable storage medium carrying a computer program monitoring network performance in a wireless communication network according to claim 17.

* * * * *